United States Patent [19]
Budde et al.

[11] Patent Number: 4,732,843
[45] Date of Patent: Mar. 22, 1988

[54] IRRADIATION CROSS-LINKABLE THERMOSTABLE POLYMER SYSTEM, FOR MICROELECTRONIC APPLICATIONS

[75] Inventors: Klaus Budde, Unterhaching; Friedrich Koch, Munich; Ferdinand Quella, Neubiberg, all of Fed. Rep. of Germany

[73] Assignee: Siemens Aktiengesellschaft, Berlin and Munich, Fed. Rep. of Germany

[21] Appl. No.: 762,513

[22] Filed: Aug. 5, 1985

[30] Foreign Application Priority Data

Aug. 10, 1984 [DE] Fed. Rep. of Germany ....... 3429606

[51] Int. Cl.$^4$ .............................................. G03C 5/00
[52] U.S. Cl. ................................... 430/312; 430/313; 430/315; 430/277; 430/275; 430/324; 430/325; 430/330; 430/286; 522/97; 522/181; 522/168; 522/182; 522/100; 526/246; 526/245; 526/270; 525/922
[58] Field of Search ............... 430/312, 313, 315, 277, 430/275, 286, 324, 325, 330

[56] References Cited

U.S. PATENT DOCUMENTS

| | | | |
|---|---|---|---|
| 3,649,274 | 3/1972 | Older et al. | 430/315 X |
| 3,909,269 | 9/1975 | Parker et al. | 430/275 X |
| 3,922,479 | 11/1975 | Older et al. | 430/312 X |
| 4,321,404 | 3/1982 | Williams | 522/137 X |
| 4,504,567 | 3/1985 | Yamamoto et al. | 430/275 X |

OTHER PUBLICATIONS

Hartmut, Steppan et al, "The Resist Technique-A Chemical Contribution to Electronics", *Angewandte Chemie Int. Engl.*, vol. 21, No. 7, 1982, pp. 455–469.
Article by A. Ledwith in "IEEE Proceedings", vol. 130, Part 1, No. 5, Oct. 1983, on pp. 245 to 251.

*Primary Examiner*—Richard L. Schilling
*Assistant Examiner*—Cynthia Hamilton
*Attorney, Agent, or Firm*—Hill, Van Santen, Steadman & Simpson

[57] ABSTRACT

Linear fluorooligomers having at least two reactive end groups per polymer molecule are incorporated into radiation sensitive polymer systems which have improved continuous temperature resistance and low dielectric constant. The polymer systems can be applied as lacquers. Preferably perfluorated poly-ethers and perfluorated alkanes are used as starting compounds. The polymeric product is usable as a coating for the production of printed multi-layer wirings and economises on through-bores and additional copper intermeidate layers. A further field of application exists in the field of integrated semiconductor ciruits in VLSI-technology for the production of negative photo-resists.

6 Claims, 2 Drawing Figures

IRRADIATION CROSS-LINKABLE THERMOSTABLE POLYMER SYSTEM, FOR MICROELECTRONIC APPLICATIONS

BACKGROUND OF THE INVENTION

1. Field of the Invention

This invention lies in the field of thermostable polymer systems which can be cross-linked by irradiation and which are adapted for microelectronic applications.

2. Prior Art

It is known that multi-layered wiring laminates can be produced by pressing onto one another thin layers of printed circuits which each contain an appropriate wiring image using adhesive foils between adjacent layers. The printed circuit layers and the adhesive foils form insulating layers between individual conductive paths. Following the formation of the multi-layered laminated circuit boards, the wiring connections and contact points between the individual layers are produced by means of bores and subsequent through-contacting of these bores.

In order to avoid crack formations in the adhesive contact layer and in the intermediate printed circuit layers, and delamination effects caused during soldering or in temperature stress changes, the process as described above has been improved upon by providing that both sides of a thin-layer printed circuit are provided with a copper layer, and each such copper layer is overcoated with a photo-resist coating. This photoresist coating, which can represent a negative or a positive image when exposed (imaged) by light while covered with a corresponding mask, is developed after imaging. The change effected by light exposure is usually one of solubility and results in solvent discrimination between exposed and unexposed areas. Photo cross-linking and photoinitiated polymerization decrease solubility, whereas photomodification of functionality and photodegration increase it. The remaining developed resin regions in a developed residual layer serves as resist regions during a subsequent etching process for the copper. A desired conductive image is thus formed in areas to which an imaged and developed resist coating adheres when a negative resist coating is used and after the exposed copper has been removed by etching. These resin residues from an imaged and developed photo resist coating are subsequently removed either with organic solvents or mechanically, and then a next layer is applied.

In the case of image formation by means of irradiation, it is necessary to differentiate between a low energy radiation region (wavelength exceeding about 100 nm) and a high energy radiation region, for example, X-rays or electron rays. Naturally, the image resolution from an exposure to an imaging radiation source increases when radiation of a shorter wavelength is used. As disclosed in an article by A Ledwith in "IEEE Proceedings", Vol. 130, Part 1, No. 5, October 1983 on pages 245 to 251, the resolution limits are about 1 $\mu$m for ultraviolet (UV) radiation and about 80 Å for electron radiation.

Conductive path intervals (widths) of less than about 20 $\mu$m are required for the construction of microelectronic components. Consequently, the material which is used must have a low dielectric constant. As disclosed in an article by A. J. Blodgett in "Spektrum der Wissenschaft", September, 1983, pages 94 to 106, the dielectric constant needs to have a value of less than about 3. It is disclosed in the same article that in the case of highly integrated components, during operation, a high thermal continuous stress (load) occurs which is approximately in the region of about 100° C.

There is a need in the art for new and improved radiation-sensitive cross-linkable polymer systems thermostable which are adapted for microelectronic applications.

BRIEF SUMMARY OF THE INVENTION

More particularly, the present invention is directed to a new and very useful thermostable polymer system which can be cross-linked by irradiation and which is adapted for microelectronic applications.

A principle aim of the invention is to provide a polymer system which can be cross-linked by exposure to light and which also possesses the following properties:
1. A dielectric constant less than about 3,
2. A continuous temperature resistance (thermal load stability) greater than about 100° C.,
3. A short exposure (imaging) time which is preferably shorter than about 5 minutes at an intensity of 100 mW/cm$^2$ (for UV-curing), and
4. Suitability for use in multi-layered wiring constructions without intermediate copper layers.

It is also desirable to provide a polymer system which can be thermally cross-linked; for example, by exposure to temperatures ranging from about 40° to 200° C.

A polymer system which has a combination of the above indicated high resolution limits and good structual stability, and which also has the required thermal load stability at 100° C. which also can be easily processed using conventional photolithographic processes, has not previously been known.

An article by C.D. Eisenbach in "Angewandte Makromolekulare Chemie" 109/110 (1982) on pages 101 to 112 discloses polyimide systems which do in fact exhibit good thermal properties following hardenability, but, during hardening, such systems suffer about a 40% loss in mass, and, therefore, exhibit a strong and undesirable shrinkage.

Furthermore, the same article discloses oligoquinoline systems which have very good electrical properties, but which are insensitive during light-exposure and which also demonstrate self-coloring.

A radiation-sensitive synthetic resin layer on a cinnamic acid epichlorohydrin-bisphenol A-base, capable of partly fulfilling the above indicated aims on which the present invention is based, has been provided in the German patent application No. P 34 24 119.1 and in U.S. patent application Ser. No. 749,588. Good structural resolution and suitable electrical properties are achieved by means of this polymer system; however, the thermal load stability is not optimal.

A new and very useful polymer system which fulfills all the above-described properties is provided by the present invention. This new polymer system is characterized by containing as starting materials linear fluorooligomers which have at least two reactive end groups per molecule and which have been reacted (converted or condensed) with radiation-sensitive (radiation-responsive) substances. It lies within the scope of the invention that such starting oligomers preferably comprise perfluorinated compounds. Such fluorinated compounds can then be reacted or converted into a polymer which is light sensitive and which contains the indicated the linear fluorooligomeric groups and which is adapted for radiation (including photo) imaging in a brief exposure period. Imaging by exposure to light radiation yields a cross-linked thermostable polymer, which, after subsequent development, leaves a film residue in exposed areas. Otherwise, if desired, it is possible to achieve a limited cross-linking of the polymer by short exposure to irradiation which after developing can be radiation cured.

Methods for making and using such new polymer system are additionally provided.

Other and further aims, objects, features, purposes, advantages, uses, and the like for the present invention will be apparent to those skilled in the art from the present specification taken together with the drawings.

DETAILED DESCRIPTION

Figure 1:
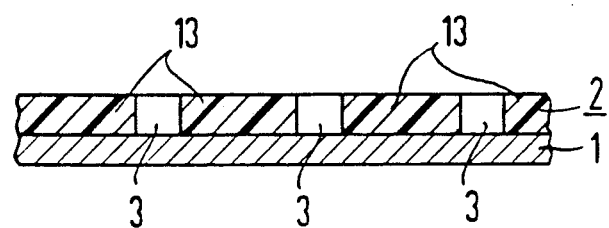
FIG. 1 is an enlarged diagrammatic fragmentary vertical cross sectional view through a laminate of copper foil and an adhering layer of an initially photo sensitive and cross-linkable polymeric composition which in the embodiment shown has already been imaged and developed in accord with the teachings of this invention.

One preferred class of such starting perfluorinated compounds comprises perfluorinated ether compounds which are characterized by the chemical formulae:

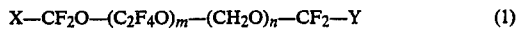
$$X-CF_2O-(C_2F_4O)_m-(CH_2O)_n-CF_2-Y \quad (1)$$

and/or

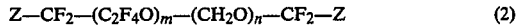
$$Z-CF_2-(C_2F_4O)_m-(CH_2O)_n-CF_2-Z \quad (2)$$

where:
X and Y are each an independently chosen terminal radical selected from the group consisting of —CH₂OH, —COOH, —COCl, and —NCO,
Z is a terminal isocyanate group containing moiety of the formula:

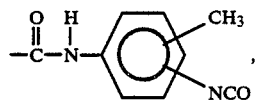

and
m and n are each a positive whole number which is greater than 2, and preferably m and n each range from about 5 to 20.

The starting compounds of formulas (1) and (2) are commercially available from the Montedison Company.

Another preferred class of such starting perfluorinated compound comprises perfluorinated alkanes which are characterized by the chemical formula:

$$X-(CF_2)_n-X, \quad (3)$$

where:
X is a terminal radical selected from the group consisting of (—CH₂OH) and iodide (—I), and n is a positive whole number greater than 2, and preferably n ranges from about 3 to 25.

The starting compounds of formula (3) are commercially available from the Hoechst Company.

Such fluorinated oligomer compounds can be directly converted to linear fluorooligomeric polymeric products which can be cross-linked by radiation. Thus, for example, such fluorinated oligomer compounds are directly reactable with radiation sensitive substances, such as at least one compound selected from the group consisting of cinnamic acid, acrylic acid, methacrylic acid, and their corresponding acid chlorides and other radiation-responsive reactable derivatives thereof. For instance, reaction products with furanacryloyl chloride can be cured by UV-radiation.

For another example, reaction products of such fluorinated oligomer compounds with difunctional carboxylic acids each containing at least one ethylenic double bond, such as maleic acid, or their corresponding anhydrides, such as maleic acid anhydride, can be cured by X-ray radiation.

In order to increase the size of the radiation sensitive (radiation cross-linkable) fluorine containing molecules, and in order to promote a cross-linking which increases the desired thermal load stability of a fluorine containing polymer system of this invention, in a further development of this invention, it is provided that the above indicated fluorinated starting materials are reacted with other substances to produce products which still contain a minimum of two reactive end groups per molecule. For example, —COCl groups can first be linked to (reacted with) at least one multi-functional, non-radiation responsive (sensitive) substance, and, then, in a next step, the resulting fluorine containing molecules are reacted with a radiation-sensitive substance (including mixtures thereof).

Examples of suitable such multi-functional, non-radiation sensitive substances with which such fluorinated starting compounds can be reacted include: (1) poly-functional alcohols (polyols), such as glycerine or pentaerythritol; (2) polyfunctional phenols, such as (a) compounds characterized by the chemical formula:

where:
Y is selected from the group consisting of

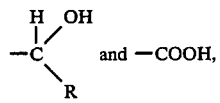

and
R is selected from the group consisting of —H and alkyl radicals;
(b) or compounds characterized by the chemical formula:

where:
X is —OH,
Y is

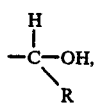

and
R is selected from the group consisting of —H and alkyl radicals;
(c) or compounds characterized by the chemical formula:

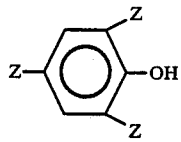
(6)

where:
Z is —CH$_2$OH; or
(3) bisphenol —A derivatives such as those characterized by the chemical formula:

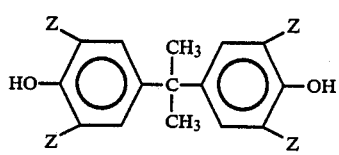
(7)

where:
Z is —CH$_2$OH; or
(4) polymers which contain at least one epoxide group per molecule, and at least one radical per polymer repeating unit which is selected from the group consisting of hydroxyl (—OH) and

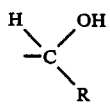

where:
R is selected from the group consisting of —H and alkyl radicals;

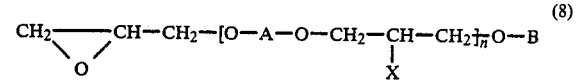
(8)

where:
A is a divalent radical, preferably

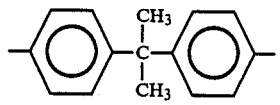

X is selected from the group consisting of —OH and

R is selected from the group consisting of —H and alkyl radicals,
B is selected from the group consisting of —H, alkyl radicals, phenyl, and (preferably)

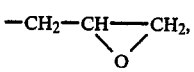

and
n is a positive whole number of at least about 2, and preferably n ranges from about 10 to 30.

Another method for making a desired polymer which can be photo-cross-linked comprises first condensing (reacting) an oligomeric fluorinated starting compound with at least one material having photo-reactive (light sensitive) groups, and then condensing (reacting) the intermediate product thus formed in a further step with a further multi-functional photo-reactive substance. The following exemplary embodiment is given:

In a first step, a fluorinated starting compound of formula (1), (2), or (3) is condensed (reacted) with a compound having photo reactive groups. For example, a compound of formula (3) is reacted with cinnamoyl chloride to produce an intermediate identified for convenience as product A:

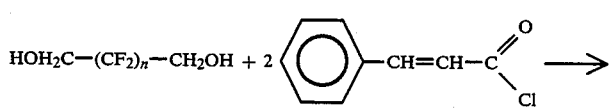

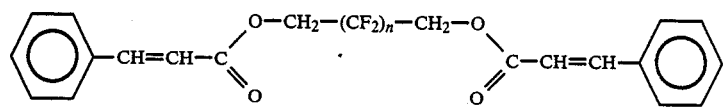
(A)

and the like.
For example, one class of such epoxide group containing multi-functional non-radiation sensitive polymers suitable for use in the practice of this invention is characterized by the chemical formula:

In a second step, product A is then condensed (reacted) with a product B consisting of a glyceryl tricinnamate (that is, the reaction product of 1 mole of glycerine and 3 moles of cinnamic acid) having the structural formula:

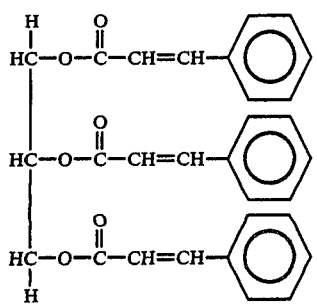

(B)

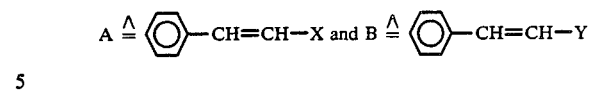

a plurality of stereoisomers exist for each cyclobutane formation (cross-linking):

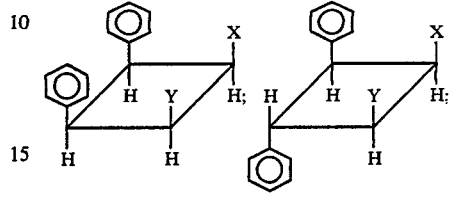

A mole ratio of product A to produce B of at least about 10:1, for example, produces an end product C having approximately the following illustrative chemical formula:

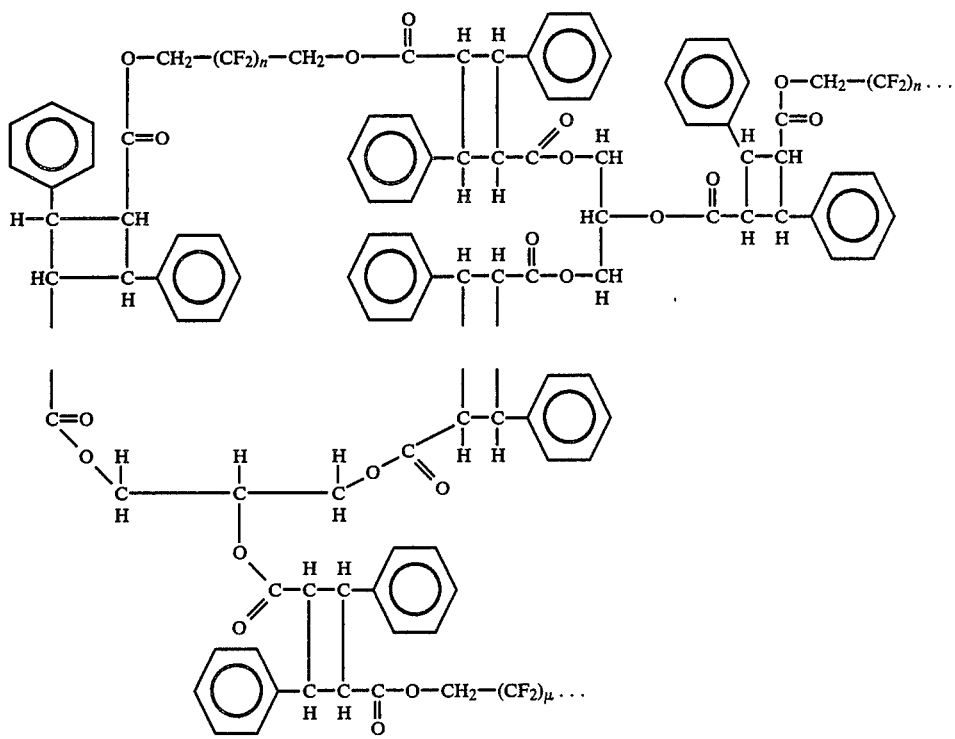

As those skilled in the art will appreciate, the above formula for product C is only one of an infinite number of arrangement possibilities for residues of, respectively, product A and product B in the cross-linked product C. Such variations in arrangement possibilities occur because:

(1) All of the following possible combinations can occur:

| (a) A—A |   |   |
|---|---|---|
| (b) A–B | } with A or B } with A or B |
| (c) B—B |   |   |

The product C is 3-dimensionally "infinitely" cross-linked.

(2) An infinite number of stereoisomers can occur. Thus, for

As a result of the different combinations under (1), an infinite number of different conformations are produced for the product.

For the implementation of the reactions, known processes are used to react epoxides or to achieve condensation reactions, such as those processes described, for example, by D. Braun in "Praktikum der Makromolekularen Chemie", published by Huthig and Wepf.

A radiation cross-linkable polymeric product in accordance with the invention can be formed into a foil and processed by the compression/lamination procedures, preferably using temperatures in the range from about 40° to 200° C., with or without metallic intermediate layers, such as those consisting of copper or copper alloys. Alternatively, such a product can be utilized as a solute in various suitable solvents for the coating of substrates, consisting in particular of metal foils or sheets, by lacquering, spraying or dipping. Such a product can be, if desired, formulated further with additives which serve as photoinitiators, sensitizers, or stabilizers. For example, a suitable photo-initiator for cinnamates comprises Michlers ketone; for acrylates, benzoin derivatives in concentrations of about 1 to 5 weight percent; and, for example, a suitable stabilizer comprises hydroquinone in concentrations of about 0.1 to 0.5 weight percent.

In the following description relating to the accompanying drawings, the use of a polymer system in accordance with the invention in order to produce a multi-layered wiring laminate is described making reference to an exemplary embodiment. As a result of the properties of a polymer of this invention system, new laminate structures are obtained utilizing an insulating carrier that is provided with electrical conductor paths and electrical through-contacts a polymer system of this invention.

Referring to FIG. 1, there is seen illustratively a copper foil 1 which can have a typical thickness ranging from about 10 to 500 μm upon one surface of which a layer 2 of a photo-cross-linkable insulating polymeric material of the present invention is deposited (coated) preferably from a solution so as to provide a dried coated layer thickness ranging typically from about 5 to 20 μm. Such polymer material can be compounded with, for example, Michlers ketone as a photo-initiator. Layer 2 is thus conveniently applied by dipping, spray-lacquering, or the like to produce a (dried) layer thickness ranging from about 5 to 20 μm.

The layer 2 is conveniently but preferably exposed to (imaged by) UV-radiation, and then is developed by solvent treatment or the like in such manner as to form the desired residual resin portions 13 with open areas 3 therebetween which expose portions of the surface of layer 1. For example, the irradiation is effected by the contact or the projection process using a mask (not shown) which in effect covers the region of each of the openings 3 in the layer 2 (negative lacquer). The covered parts 3 are then dissolved away using an appropriate solvent, such as, for example, a chlorofluorocarbon (for example, Freon® of the Dupont Company or Fluorinert® of the 3M Company). In the case of the residual exposed portions 13 of the layer 2, a chemical cross-linking has taken place during the irradiation which prevents dissolution thereof so that these parts 13 remain as insulating layer after the development (solvent treatment).

Figure 2:
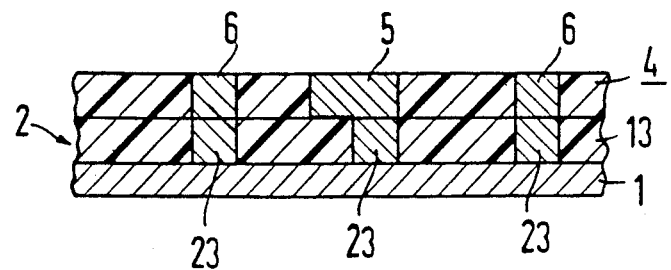
FIG. 2 is a view similar to FIG. 1 but with an additional layer of such a polymeric composition applied over the initial layer, such additional layer having been processed similarly to the layer of FIG. 1.

Following the production of the openings 3 for the through-contacts assigned to this first insulating layer 2 and its residual exposed portions 13, the openings 3 as defined by the portions 13 and foil 1 are effectively filled in by means of metal plating using an electrically highly conductive material, such as for example, copper, thereby producing the desired through-contact regions 23 as shown in FIG. 2.

Referring to FIG. 2, a further layer 4 is next applied over the layer defined by portions 13 and regions 23. Layer 4 is likewise comprised of a photo-cross-linkable insulating polymeric material in accordance with the invention and is applied in the same way as described in reference to FIG. 1. In layer 4 conductor paths are formed and then filed with electrically highly conductive material in the same way as described in reference to FIG. 1, thereby to provide through-contact regions 5 and 6. The exposure and development of the layer 4 likewise takes place as described in FIG. 1. In addition to the openings for the through-contact, regions 6 which come into contact with the through-contact regions 23 in the first insulating layer portions 13, trench-like recesses for the through contact regions 5 are also produced in the second insulating layer 4, and such trench-like recesses are arranged in such manner that at least one through-contact region 23 makes contacting association with through-contact region 5. The through-contact regions 5 and 6 are conveniently formed by electroplating. Further through-contacts and conductor paths can then be applied by corresponding repetition of the above-described production steps. Between the individual layer formations, the arrangements are subjectable to a drying and/or thermal curing process by heating to temperatures in the range from about 40° to 150° C.

The novel wiring construction requires no copper intermediate layers. The required high thermal load stability is achieved. The processing with known photo resist techniques is problem-free. This simplifies not only the process for the production of such a construction, but also the reliability in respect of electrical characteristics.

For this reason, and also on account of the very low Dc and the good resolution, the polymer systems in accordance with the invention are best suitable for use as high-temperature-resistant negative resists in the production of integrated semiconductor circuits in VLSI-technology where the production of dimensionally accurate microstructures and patterns is of great significance. The exposure time is comparable with the latter systems which can be used in this field. Further details can be obtained from the article by C. D. Eisenbach in the magazine "Die Angewandte Makromolekulare Chemie" 109/110 (1982) on pages 101 to 112.

As is apparent from the foregoing specification, the invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

EMBODIMENTS

The present invention is further illustrated by reference to the following examples. Those skilled in the art will appreciate that other and further embodiments are obvious and within the spirit and scope of this invention from the teachings of these present examples taken with the accompanying specification.

I.

LIGHT SENSITIVE FLUORINATED OLIGOMERS (1) In a three-necked flask equipped with a reflux condenser 200 g of Fomblin Z-DOL 2000 (0.1 mol)

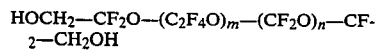

are suspended in xylene. 34 g (0.2 mol) of dried cinnamoyl chloride (liquid, 50° C.) are slowly added under vigorous stirring. The mixture is slowly heated to 100°–110° C. and held at this temperature for 5 hours till no free HCl can be detected any more.

(2) In the case of carboxylic end groups or acid chloride end groups the reaction is done in a similar way be adding the cinnamic alcohol. If using the carboxylic acid the condensation reaction is achieved by azeotropic distillation.

(3) Isocyanates (Fomblin Z-Disoc) are converted by slowly adding cinnamoyl alcohol in xylene.

For (2) and (3):
curable by irradiation with electron beam.

For (1)–(3):
The reaction products are precipitated in methanol (1:4), washed and dried under vacuum at 50° C. The same procedure is used for the reaction of perfluoroalkyl alcohols with cinnamoyl chloride. In all cases, instead of cinnamoyl chloride furan-acryloyl chloride can be used.

II.

COPOLYMERIZATION AND CURING AGENTS (4) Commercial grade expoxies like bisphenol A-based Araldit ® are converted to light sensitive polymers by means of cinnamoyl chloride.

650 g Araldit GT 6099 and 3.5 l toluene are given into a 4 l flask and 740 g cinnamoyl chloride (dried, liquid, 50° C.) slowly added. The mixture is vigorously stirred and slowly heated up to 90° C. for 2 hours. After 4 additional hours at 110° C. no acid can be detected any more. The product is precipitated in methanol (1:4), washed and dried at 50° C., in vacuo.

(5) Instead of cinnamoyl chloride, furan acryloyl chloride can be used in a similar manner.

The light sensitive epoxy-based resins are mixed (1:1, molar ratio, related to the cinnamic and acrylic acid derivatives respectively) with the light sensitive fluorinated oligomers known from examples (1)–(3) in trichloroethylene. Coating on to copper foils is achieved by spraying or dipping in a closed box with a solvent almost saturated atmosphere.

(6) The light sensitive fluorinated oligomers (cf. examples (1)–(3)) are mixed in xylene with a polyfunctional light sensitive agent e.g.

either 2–5% wt PETEA } (Morton-Thiokol)
or 5–10% wt PETA
or 10% wt Sr-399   (Sartomer Comp.)

or 10% wt tricinnamoyl glycerine ester;

depending upon whether cinnamoyl chloride or furan acryloyl chloride was used in examples (1)–(3).

Tricinnamoyl glycerine ester is prepared from glycerine and cinnamoylchloride (mol ratio 3.5:1) in triethylamine and crystallized from ethanol.

Coating is achieved by spraying or dipping (s. before). The coatings were dried by IR irradiation at 90° C. in contact with metal.

UV curing of 10 μm coatings (cf. example 2) needed 25 minutes (20 mW/cm$^2$) for cinnamic derivatives and about 5 minutes for acrylic derivatives.

We claim:

1. A process for the production of a multi-layered wiring laminate using a polymer system comprising an irradiation cross-linkable thermostable polymer for use in the manufacture of multi-layer wiring systems having a reaction product of a fluorinated linear oligomer having at least two reactive end groups per polymer molecule with a radiation-sensitive substance the process comprising the steps of: (a) coating a metal foil with said polymer (b) imaging such coating with a desired wiring pattern by irradiation with masked light, (c) dissolving away the non-irradiated portions of such resulting irradiated coating to produce a developed wiring image in the resulting coating, (d) electroplating portions of said metal foil where such portions are exposed through said developed resulting coating, and (e) depositing over the resulting so electroplated surface at least one additional coating of said polymer, and (f) repeating said steps (b), (c), and (d) with respect to each said additional coating, thereby to produce a desired multilayered wiring laminate.

2. The process of claim 1 wherein said irradiation is effected with UV-light using masks in a contact or a projection method.

3. The process of claim 1 wherein said dissolving is carried out with a halogenated hydrocarbon.

4. The process of claim 3 wherein said halogenated hydrocarbon is a chlorofluorocarbon.

5. The process of claim 1 wherein, after step (c) and before step (d) the resulting construction is exposed to a temperature ranging from about 40° to 150° C.

6. In a process for the production of negative photoresist layers in the production of integrated semiconductor circuits in VLSI-technology, the improvement which comprises employing as the negative photo-resist layers an irradiation cross-linkable thermostable polymer for use in the manufacture of multilayer wiring systems comprising a reaction product of a fluorinated linear oligomer having at least two reactive end groups per polymer molecule with a radiation-sensitive substance.

* * * * *